(12) United States Patent
Melvin, III

(10) Patent No.: US 7,251,806 B2
(45) Date of Patent: Jul. 31, 2007

(54) MODEL-BASED TWO-DIMENSIONAL INTERPRETATION FILTERING

(75) Inventor: Lawrence S. Melvin, III, Hillsboro, OR (US)

(73) Assignee: Synopsys, Inc., Mountain View, CA (US)

( * ) Notice: Subject to any disclaimer, the term of this patent is extended or adjusted under 35 U.S.C. 154(b) by 386 days.

(21) Appl. No.: 10/822,107

(22) Filed: Apr. 9, 2004

(65) Prior Publication Data

US 2005/0229148 A1    Oct. 13, 2005

(51) Int. Cl.
*G06F 17/50* (2006.01)

(52) U.S. Cl. ....................................................... 716/21
(58) Field of Classification Search ................... 716/21
See application file for complete search history.

(56) References Cited

U.S. PATENT DOCUMENTS 6,453,457 B1 *   9/2002   Pierrat et al. ................. 716/19
6,539,521 B1 *   3/2003   Pierrat et al. ................. 716/4
6,584,609 B1 *   6/2003   Pierrat et al. ................. 716/19
7,039,896 B2 *   5/2006   Medvedeva et al. .......... 716/19
2003/0140330 A1 *   7/2003   Tanaka et al. ................. 716/19

* cited by examiner

*Primary Examiner*—Jack Chiang
*Assistant Examiner*—Brandon Bowers
(74) *Attorney, Agent, or Firm*—Bever, Hoffman & Harms, LLP; Jeanette S. Harms

(57) ABSTRACT

Complex layout features, especially two-dimensional (2D) features such as jogs and corners, are more susceptible to photo-resist pinching and bridging, even with the use of optical proximity correction. These problems may arise due to unrealistic targets, e.g. square corners, thereby resulting in excessively aggressive correction in the vicinity of these 2D features. To provide a more realistic target, an aerial image can be sampled and its gradient computed at evaluation points on the 2D feature. The aerial image contains spatial information about the local pattern and the interaction of the pattern with the manufacturing process. This information can be used to predict a feasible shape or curvature for the 2D feature. The predicted shape can then be used to retarget the 2D feature based on realistic process capabilities.

36 Claims, 9 Drawing Sheets

500

510

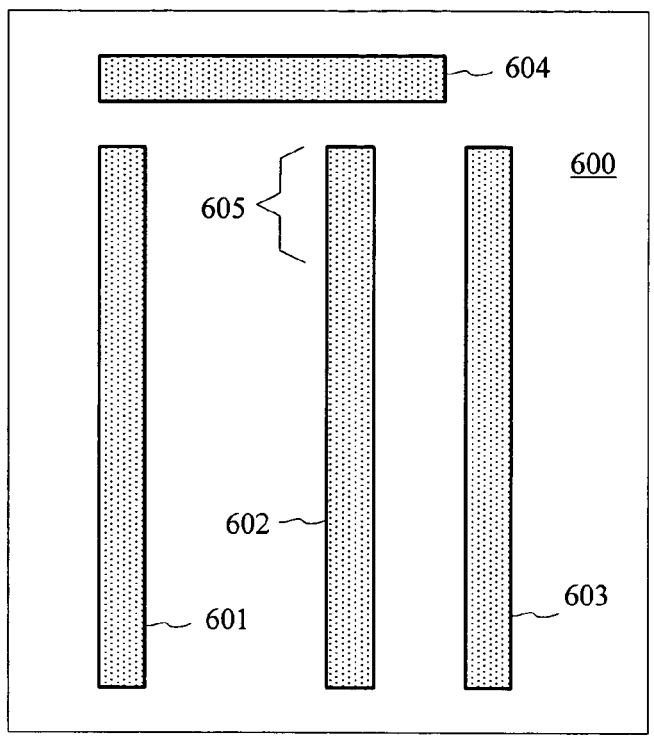
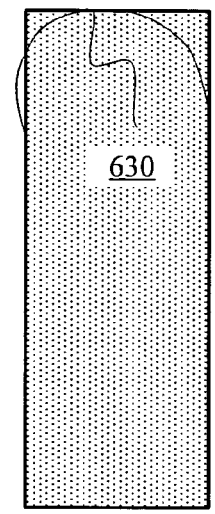
Figure 6E
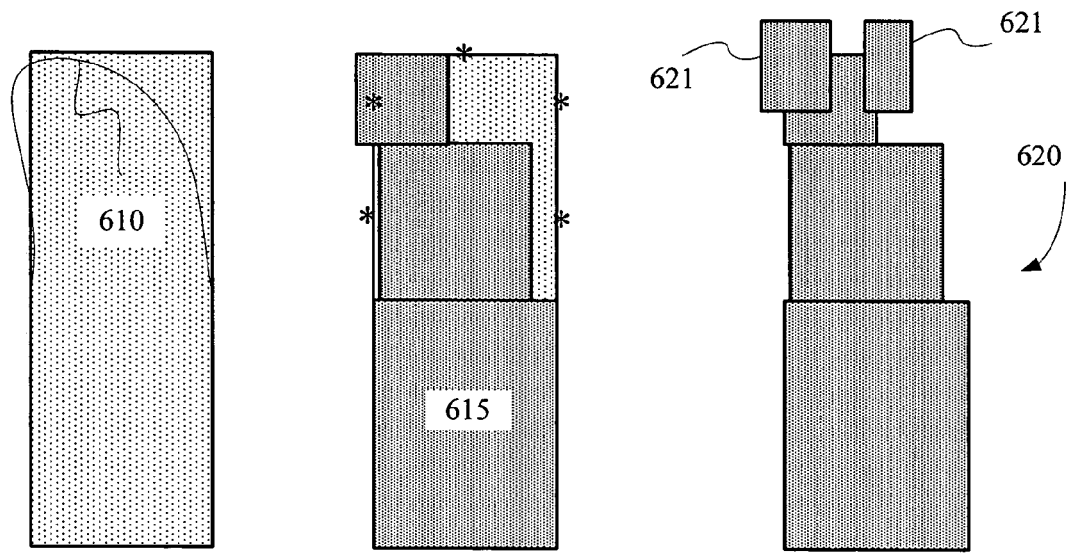
Figure 6B    Figure 6C    Figure 6D
Figure 6A

MODEL-BASED TWO-DIMENSIONAL INTERPRETATION FILTERING

BACKGROUND OF THE INVENTION

1. Field of the Invention

The present invention generally relates to a mask layout and in particular to optimizing two-dimensional features on a mask layout using interpretation filtering before optical proximity correction.

2. Description of the Related Art

In designing an integrated circuit (IC), engineers typically rely upon computer simulation tools to help create a circuit schematic design consisting of individual devices coupled together to perform a certain function. To actually fabricate this circuit on a semiconductor substrate the circuit must be translated into a physical representation, or layout, which itself can then be transferred onto a template (i.e. a mask or reticle, hereinafter called a mask), and then to the silicon surface. Again, computer aided design (CAD) tools assist layout designers in the task of translating the discrete circuit elements into shapes, which will embody the devices themselves on the completed IC. These shapes make up the individual components of the circuit, such as gate electrodes, field oxidation regions, diffusion regions, metal interconnections, and so on.

Once the layout of the circuit has been created, the next step to manufacturing the integrated circuit (IC) is to transfer the layout onto a semiconductor substrate. One way to do this is to use the process of optical lithography in which the layout is first transferred onto a physical template, which is in turn used to optically project the layout onto a silicon wafer.

In transferring the layout to a physical template, a mask (usually a quartz plate coated with chrome) is generally created for each layer of the integrated circuit design. This is done by inputting the data representing the layout design for that layer into a device such, as an electron beam machine, which writes the integrated circuit layout pattern into the mask material.

These masks are then used to optically project the layout onto a silicon wafer coated with photo-resist material. For each layer of the design, a light is shone on the mask corresponding to that layer. This light passes through the clear regions of the mask, whose image exposes the underlying photo-resist layer. The light is blocked by the opaque regions of the mask, thereby leaving the underlying portion of the photo-resist layer unexposed. The exposed photo-resist layer is then developed, typically, through chemical removal of the exposed/non-exposed regions of the photo-resist layer. The end result is a semiconductor wafer coated with a photo-resist layer exhibiting a desired pattern, which defines the geometries, features, lines and shapes of that layer. This process is then repeated for each layer of the design.

FIG. 1A illustrates a standard mask layout feature 100 that can be used to form a transistor. Diffraction effects, photo-resist processing effects, other processing effects, and/or combinations of one or more effects can cause distortions of mask layout feature 100 during lithography. FIG. 1B illustrates that such distortions can cause an ideal printed line end 101 of mask layout feature 100 to transfer to a wafer as actual printed line end 102. Notably, actual printed line end 102 is shorter and exhibits more rounded corners than ideal printed line end 101. Unfortunately, these distortions can cause adverse effects on the functioning of a printed circuit including feature 100.

To solve the problem associated with lithographic distortions, optical proximity correction features, e.g. hammer-heads or serifs, can be added to the layout. FIG. 2A illustrates exemplary serifs 201 that can be added to mask layout feature 100 (FIG. 1A). FIG. 2B illustrates that serifs 201 can cause ideal printed line end 106 to transfer to a wafer as actual printed line end 202. Note that actual printed line end 202 is substantially the same length as ideal printed line end 106, thereby resolving the line end shortening problem.

Unfortunately, actual printed line end 202 now exhibits other undesirable characteristics. Specifically, this line end has a bulbous feature in addition to a pinch point. This phenomenon is sometimes called Q-tipping because of the resulting shape. This phenomenon is caused by constructive interference nodes, which are created during the lithographic process and occurs around all two-dimensional features. The effect of Q-tipping (i.e. the offset from the ideal printed line edge) can be significant, e.g. 10% or more of the line width per side, thereby resulting in an 80 nm wide pinch point for a nominally 100 nm wide line. Therefore, in features formed in close proximity, bridging between features may occur because of their bulbous portions.

The pinched portions of the line ends can also become problematic. Specifically, in a standard IC manufacturing process, variations in through-process effects can exacerbate the pinching. Through-process effects can include, for example, the dose and focus variation from the nominal conditions provided by a photolithography stepper as well as the variations in the thickness or other characteristics (e.g. bake temperature, chemical composition, water quality, ambient temperature, etc.) of a photo-resist used on a wafer. Therefore, for example, if a contact is to be formed underneath a line end, then the pinched portion of the line end in combination with through-process variations could result in an open circuit for that contact.

These through-process variations can occur despite the best intentions of the manufacturer. Setting and resetting a tool to correct for such through-process effects can take significant time, e.g. on the order of 12 hours. Logically, the less time needed to perform maintenance for such through-process variations can improve the cost effectiveness of the equipment. That is, the equipment is on-line more, thereby producing more products per unit of time.

Therefore, a need arises for a technique to more effectively correct for lithographic distortions while providing a technique that is less sensitive to (i.e. more tolerant of) through-process effects.

SUMMARY OF THE INVENTION

Optical proximity correction (OPC) is a technique of modifying features in a mask layout. These modified features, when exposed during lithography, should form printed features as close as possible to the original layout (i.e. the desired) features. Unfortunately, conventional OPC is performed on unrealistic targets, i.e. 90-degree corners in the mask layout, thereby resulting in excessively aggressive correction in the vicinity of two-dimensional (2D) features. Two-dimensional features can include line ends, outside corners, inside corners, slots, and jogs. These over-corrections can result in pinching (i.e. a line that is too thin) and/or bridging (i.e. adjacent lines being connected) on the wafer.

In accordance with one aspect of the invention, a more realistic OPC target can be provided, thereby optimizing subsequent OPC and minimizing over-correction. To generate this OPC target, an aerial image can be sampled and its gradient computed at predetermined points on the 2D features. The aerial image advantageously includes spatial information about the local pattern and the interaction of the pattern with the manufacturing process. This information can be used to predict a feasible shape (i.e. curvature) for the 2D feature. The predicted shape can then be used to re-target the edges of the 2D feature based on realistic process capabilities.

In one embodiment, to determine the points used for aerial image sampling, the edges of features in a mask layout can be dissected into a plurality of segments, wherein each segment has an evaluation point. In one embodiment, 2D segments in the mask layout can be identified. The 2D segments can include those segments forming the 2D features, e.g. the segments at and near corners of the 2D features.

The aerial image gradient can be measured at the evaluation point on each 2D segment. A normal shift for the 2D segment can be determined based on that aerial image gradient. In one embodiment, determining the normal shift for the 2D segment can be computed using one of the following exemplary equations:

$$NormalShift = -\frac{GradientMagnitude^2}{Q} - \frac{GradientMagnitude}{R} - S$$

$$NormalShift = T_0 - AngleShift\left(1 - \frac{GradientAngle}{GradientAngle_0}\right) - MagShift\left(1 - \frac{GradientMagnitude}{GradientMagnitude_0}\right)$$

$$NormalShift = -\frac{GradientMagnitude^2}{F} - \frac{GradientAngle^2}{G} - \frac{GradientMagnitude}{H} - \frac{GradientAngle}{J} - \frac{GradientAngle * GradientMagnitude}{K} - L$$

wherein F, G, H, J, K, L, Q, R, and S are empirically-derived constants based on sampled corner performance, $T_0$ is the nominal normal shift, AngleShift is the maximum normal shift component due to the aerial image gradient, GradientAngle is the measured angle of the aerial image gradient, $GradientAngle_0$ is the base angle where no shift is applied, MagShift is the maximum normal shift component due to the aerial image magnitude, GradientMagnitude is the measured aerial image magnitude, and $GradientMagnitude_0$ is the base magnitude where no shift is applied. Note that other equations may be used to best fit the aerial image/target space.

The modified position of the 2D segment can be saved as part of an "interpreted" pattern. In one embodiment, the interpreted pattern can include the modified positions of all 2D segments.

In accordance with another aspect of the invention, a method of performing optical proximity correction on a mask layout is also provided. In this method, after receiving the mask layout, interpretation filtering can be performed to generate an interpreted pattern for at least one feature of the layout. The interpretation filtering can include the above-described aerial image sampling and aerial image gradient computation. Optical proximity correction can then be run using the interpreted pattern, thereby generating a corrected mask pattern. In one embodiment, additional interpretation filtering can be performed during OPC to further adjust the corrected mask pattern.

In another embodiment, interpretation filtering can be manipulated to take advantage of spacing in a layout. For example, bulbous line ends without pinching can be useful for lines that are less closely spaced. Specifically, a bulbous line end (without pinching) can advantageously survive better through process. The constants provided during computation of interpretation filtering can be chosen to create these bulbous line ends in areas of the layout where adequate space is available, as determined by the gradient evaluation.

A computer-implemented program including instructions for performing the above-described steps can also be provided.

BRIEF DESCRIPTION OF THE FIGURES

FIG. 6A illustrates a simplified mask layout including a plurality of lines.

FIG. 6B illustrates an attainable shape for one of the line ends in FIG. 6A.

FIG. 6C illustrates an interpreted pattern for the line end shown in FIG. 6B. This interpreted pattern can include blocks that are intentionally weighted to one side (i.e. asymmetrical), as determined by the interpretation filter.

FIG. 6D illustrates an exemplary OPC-corrected feature based on the interpreted pattern of FIG. 6C.

FIG. 6E illustrates a predicted output contour based on exposure of the OPC-corrected feature of FIG. 6D.

DETAILED DESCRIPTION OF THE FIGURES

Figure 1A:
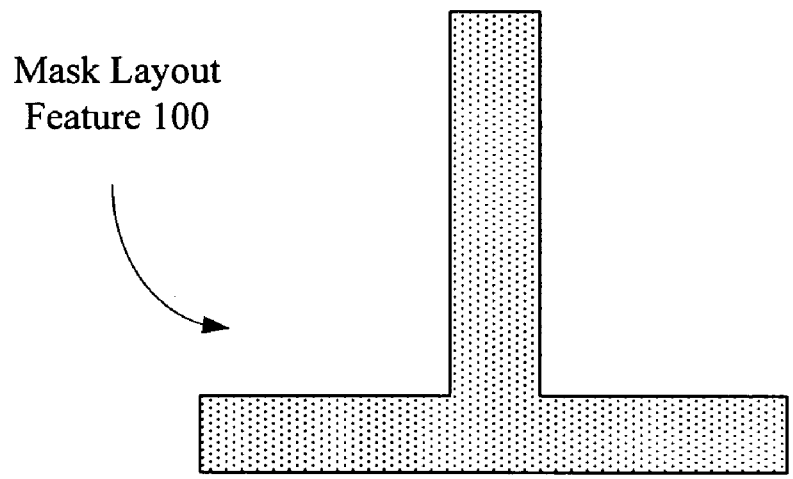
FIG. 1A illustrates a standard layout structure for forming a transistor.
Figure 1B:
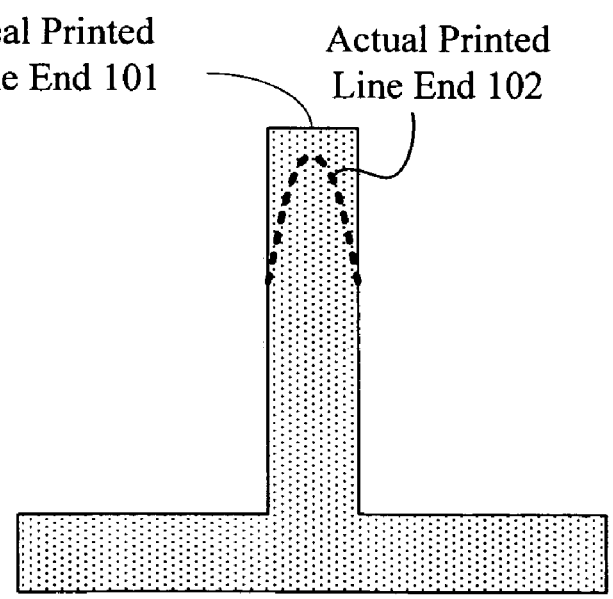
FIG. 1B illustrates a shortened and rounded printed line end that can result from exposing the feature of FIG. 1A without optical proximity correction.
Figure 2A:
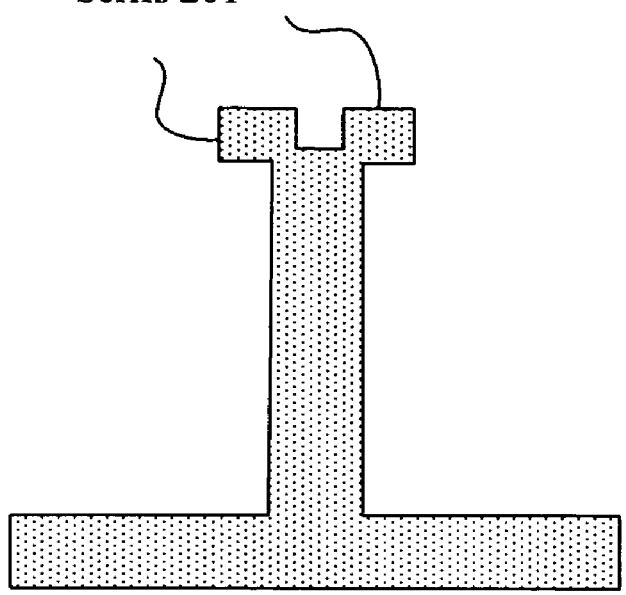
FIG. 2A illustrates exemplary serifs that can be added to the line end of FIG. 1A to correct for line end shortening and rounding.
Figure 2B:
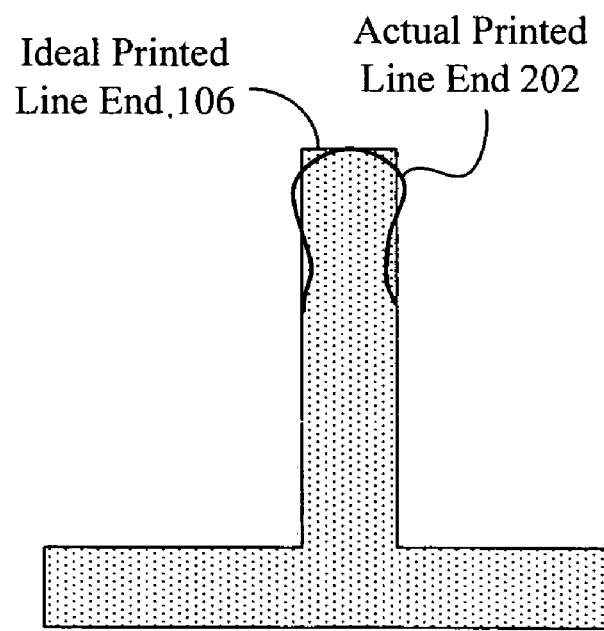
FIG. 2B illustrates that exposing the feature of FIG. 2A having OPC can correct for line end shortening, but can result in a Q-tipping effect. This Q-tipping effect can undesirably create a bulbous portion and a pinched portion on the line end.

Optical proximity correction (OPC) attempts to correct for the distortion of mask features during lithography. Specifically, OPC tries to form printed features as similar as possible to features on the original mask layout. Unfortunately, by using a mask layout as input, OPC can frequently overcorrect for the distortion problem. This over-correction can add more chrome than necessary to produce an adequate correction. For example, this over-correction can generate bulbous portions at line ends, thereby increasing the potential for bridging between adjacent printed features. Additionally, this over-correction can also result in pinching near the line ends, thereby also increasing the potential for open circuits in the printed circuit.

In accordance with one aspect of the invention, instead of applying OPC to a typical mask layout corner, i.e. a square corner, OPC can be applied to a more realistic "interpreted" corner. In other words, at the very small sub-wavelength feature sizes, there is simply no light source having a small enough wavelength to produce perfect square corners. However, the tool performing the OPC attempts to reach this unattainable target, thereby resulting in an excessively aggressive correction in the vicinity of the corner.

Advantageously, using corners with rounded corners (e.g. inscribing a curve within an ideal printed line end) would give the OPC tool a significantly more realistic target (that is, a rounded corner reflects what a square corner formed in exposed photo-resist would really look like). As a result of using a more realistic target as input, the OPC tool would make a significantly less aggressive correction to the corners. Creating the rounded corners for a line end can be done using the width and length, i.e. the local geometry, of the line end. This methodology appears to provide satisfactory corrections for process nodes down to 90 nm. However, as process nodes push below 90 nm, more information is needed to generate optimized OPC corrections and to ensure that such corrections are less sensitive to (i.e. more tolerant of) through-process effects.

In accordance with one aspect of the invention, an aerial image gradient can be used to accurately determine the entire influence on a corner. Specifically, all adjacent features to a corner, within a Gaussian-type distribution, can have some influence on the imaging of the corner. The aerial image of a feature can show the intensity of light versus position as a result of the lithographic process. Thus, the aerial image contains spatial information about the adjacent features, i.e. the local pattern, as well as the interaction of the local pattern with the lithographic process.

The aerial image gradient includes both the magnitude and the direction of the slope of the aerial image at its edge. In other words, the gradient is the directional rate of change. For example, for a point on a line end, the aerial image gradient can indicate how fast the intensity of light is changing (one-dimensional (1D) information) and in what direction (two-dimensional (2D) information). A useful analogy to the aerial image gradient would be skiing downhill using a minimal energy path (i.e. the fastest direction the person can ski).

This aerial image gradient can be used to predict an "attainable" shape, i.e. the realistic curvature, for the corner. The attainable shape can then be used to modify the mask layout feature based on realistic process capabilities. In one embodiment, this modification can be based on a dissection of edges of the feature, which can form part of an optimized OPC recipe.

Specifically, a process model is typically built for a particular suite of equipment and equipment settings used to perform the fabrication process. The model can be built by performing the fabrication process one or a few times with test patterns on one or more mask layouts, observing the actual features printed (for example with a scanning electron micrograph), and fitting a set of equations or matrix transformations that most nearly reproduce the locations of edges of features actually printed as output when the test pattern is provided as input. The output of the process model is typically expressed as an optical or signal intensity.

A process model consumes computational resources by an amount that is related to the number of points of interest where amplitudes are computed. For typical mask layouts, the number of points where the model could be run is large, thereby resulting in a potentially prohibitive computation time. Therefore, the process model is typically run at selected points, i.e. evaluation points, located on the edges of features.

To generate these evaluation points, edges of a polygon in a mask layout can be dissected into segments defined by dissection points, wherein each segment can have an evaluation point. A technique for spacing of the evaluation points and dissection points can be automatically adapted based on where changes in the proposed mask layout are most likely needed. Specifically, dissection points are closer together where proximity effects are more significant and are farther apart where proximity effects are less significant.

Segments can be characterized as being one-dimensional (1D) or two-dimensional (2D). In general, a 2D segment forms part of a 2D feature, e.g. a line end, an outside corner, an inside corner, a slot, and a jog, on the mask layout. In other words, a 2D segment is connected or close to a corner. More specifically, a 1D segment includes an evaluation point having an aerial image gradient that is always near normal (i.e. substantially perpendicular to the original edge of the feature). The closer the segment to a corner, the aerial image gradient of an evaluation point on that segment has an increased non-normal direction. Thus, a corner of a line end is always 2D. In one embodiment, if segment S is typically characterized as 1D, but is being influenced by a 2D segment of an adjacent feature, then segment S may be characterized as 2D.

Note that segments can be characterized and tagged as 2D during dissection. In one embodiment, certain "types" of segments can be tagged. For example, tags could identify line ends, outside corners, inside corners, slots, and jogs. These tags can be used as 2D tags. In other embodiments, additional properties can be assigned to segments in the layout, thereby identifying the segments as 2D.

Figure 3A:
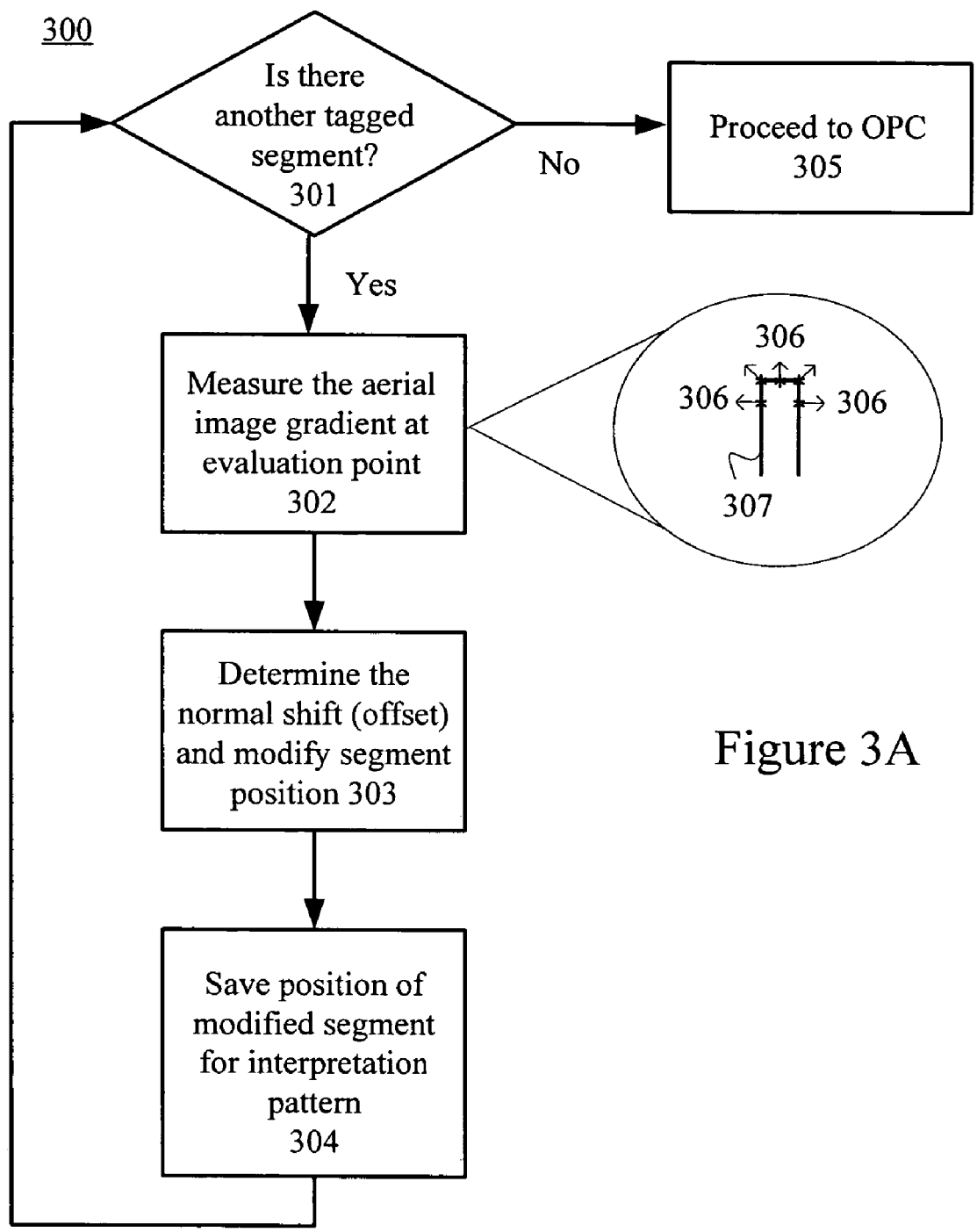
FIG. 3A illustrates an exemplary interpretation filtering operation in which an aerial image gradient of an evaluation point can be used to modify segment position.

FIG. 3A illustrates an exemplary interpretation filtering operation 300 in which an aerial image gradient of an evaluation point can be used to modify segment position. Step 301 determines if there is a tagged segment (e.g. a 2D tag) for analysis. If there is a tagged segment for analysis, then step 302 can sample the aerial image and measure the aerial image gradient at the evaluation point on that segment. This aerial image gradient can include information about the magnitude and the direction of the slope of the aerial image at the evaluation point. These magnitude and direction components of the aerial image gradient can be expressed as vectors, e.g. vectors 306 for evaluation points on feature 307.

Using the aerial image gradient information, step 303 can determine the shifted position of the evaluation point, wherein the shifted position is normal (i.e. perpendicular) to the segment. This shifted position, which is also called the offset, can be used to generate a target. Specifically, the segment including the evaluation point can be shifted by this offset to generate an interpreted pattern, i.e. the target.

In one embodiment, the targeting methodology can be defined by one of the following three exemplary equations (listed in ascending order of complexity):

$$NormalShift = -\frac{GradientMagnitude^2}{Q} - \frac{GradientMagnitude}{R} - S$$

$$NormalShift = T_0 - AngleShift\left(1 - \frac{GradientAngle}{GradientAngle_0}\right) -$$

$$MagShift\left(1 - \frac{GradientMagnitude}{GradientMagnitude_0}\right)$$

$$NormalShift = -\frac{GradientMagnitude^2}{F} - \frac{GradientAngle^2}{G} -$$

$$\frac{GradientMagnitude}{H} - \frac{GradientAngle}{J} -$$

$$\frac{GradientAngle * GradientMagnitude}{K} - L$$

wherein F, G, H, J, K, L, Q, R, and S are empirically-derived fit constants based on sampled corner performance (e.g. Q=17.6, R=0.2564, and S=−20.2), NormalShift is the amount that a segment's target is shifted normal to the segment, $T_0$ is the nominal normal shift, AngleShift is the maximum normal shift component due to the aerial image gradient, GradientAngle is the measured angle of the aerial image gradient, $GradientAngle_0$ is the base angle where no shift is applied, MagShift is the maximum normal shift component due to the aerial image magnitude, GradientMagnitude is the measured aerial image magnitude, and $GradientMagnitude_0$ is the base magnitude where no shift is applied. Note that this targeting methodology can advantageously shift the curve from a nominal location based on the tightest pitch to more relaxed curvatures as the aerial image contrast increases. Note that other equation forms may be used to fit the aerial image/target space.

In one embodiment, the first (i.e. the least complex) equation can be applied to 160 nm (and greater) line/space design rules, the second (i.e. the medium complexity) equation can be applied to 130-160 nm line/space design rules, and the third (i.e. the most complex) equation can be applied to below 130 (e.g. 45) nm line/space design rules.

In step 304, the positions of the modified segments can be saved. These positions comprise an interpretation pattern. At this point, process 300 can return to step 301. If there are no further tagged segments to be analyzed, then step 305 can proceed to OPC. Advantageously, OPC can be performed on the interpretation pattern, thereby optimizing correction of the mask layout.

Figure 3B:
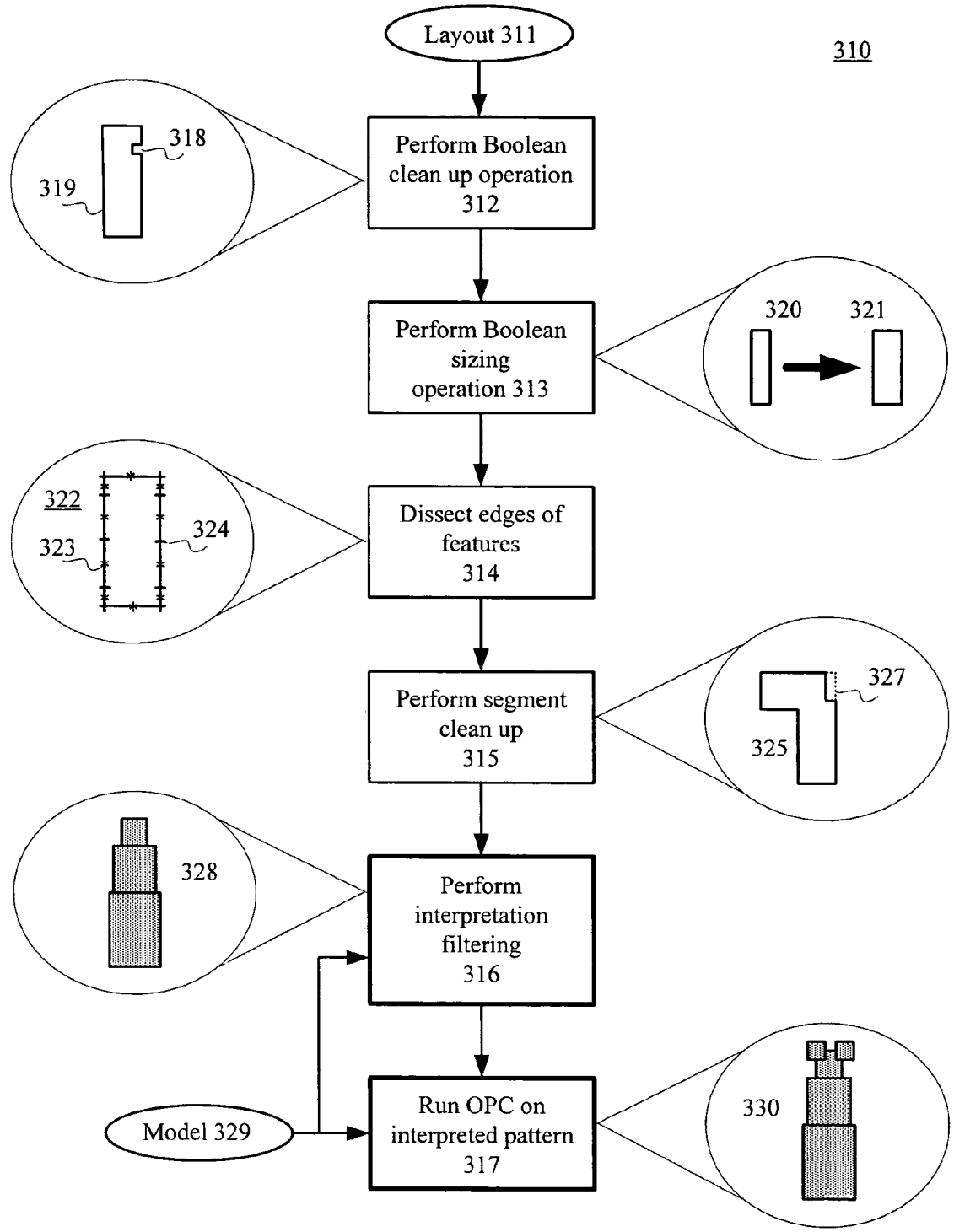
FIG. 3B illustrates a layout process flow including interpretation filtering for minimizing lithographic distortion.

FIG. 3B illustrates a layout process flow 310 including interpretation filtering and OPC. An input to flow 310 can include a mask layout 311. Layout 311 can be a GDS file or any pattern generated by a CAD tool or stored in a design database. Step 312 can use layout 311 to perform an optional Boolean clean-up operation. This clean-up operation could include checking design rules (DRC), filling inadvertently formed notches (e.g. notch 318 of feature 319), and removing overlays. Step 313 can include performing an optional Boolean sizing operation, if necessary. For example, if layout 311 specifies a 90 nm design rule, but the photo-resist to be used in the manufacturing process etches down by 10 nm, then all 90 nm lines (e.g. line 320) can be sized up by 10 nm (see, e.g. sized-up line 321) in step 313. Note that the Boolean clean-up and sizing operations can be performed at the polygon level, thereby providing an efficient correction of layout 302.

Step 314 can include dissecting the edges of a feature and placing evaluation points on the resulting segments. For example, after step 314, a feature 322 can have evaluation points 323 placed on the segments created by dissection points 324. Exemplary dissection and placement techniques are described in U.S. patent Ser. No. 10/683,534, which was filed on Oct. 10, 2003 by Synopsys, Inc., and is incorporated by reference herein.

Step 315 can perform a segment clean up. For example, a segment clean up can restore a corner 327 (indicated by a dotted line) of feature 325. This optional segment clean up can simplify subsequent process steps.

Of importance, step 316 can perform interpretation filtering on identified evaluation points, e.g. evaluation points on 2D segments, using a process model 329. As previously described, 2D segments can include segments near any corners, including but not limited to line ends, inner corners, outer corners, cutouts, slot ends, and jogs.

Interpretation filtering can include sampling the aerial image and computing the aerial image gradient at the identified evaluation points. This gradient information can be used to determine normal shifts to the segments including the evaluation points. A feature including the shifted segments can form an interpreted pattern. For example, interpretation filtering can manipulate the segments associated with the identified evaluation points to generate an interpreted pattern 328.

The interpreted pattern generated by interpretation filtering can significantly minimize over-correction during OPC.

Step 317 can run OPC of the layout using the interpreted pattern as well as process model 329, thereby generating a corrected mask pattern 330. Running process model 329 at the evaluation points determines the OPC correction needed at each evaluation point. Note that the same evaluation points (although moved by the interpretation filter) can be used for determining the aerial image gradients and performing OPC. The OPC-corrected pattern, e.g. corrected pattern 330, can be used to manufacture the mask. In one embodiment, additional interpretation filtering can be performed during OPC to further adjust corrected pattern 330. In one embodiment, steps 312-317 can be implemented in a software tool. For example, the Proteus™ tool, licensed by Synopsys, Inc., can be used to perform the OPC recipe including steps 312-317.

In one embodiment, process model 329 can include an optical model, a photo-resist model, an etch model, and/or other models to facilitate predicting the locations of edges of features actually printed as output when the interpreted pattern is provided as input. In one embodiment where speed is critical, step 316 can use the optical model whereas step 317 can use a full (also called a calibrated) model (which includes all available models). In another embodiment where accuracy is more important than speed, both steps 316 and 317 can use the full model. As technology nodes become smaller, e.g. perhaps at a 45 nm technology node and below, the full model may be desirable for both steps 316 and 317. Note that using a more complex equation for computing the amount of shift for 2D segments can effectively compensate for a less than full model.

Figure 4A:
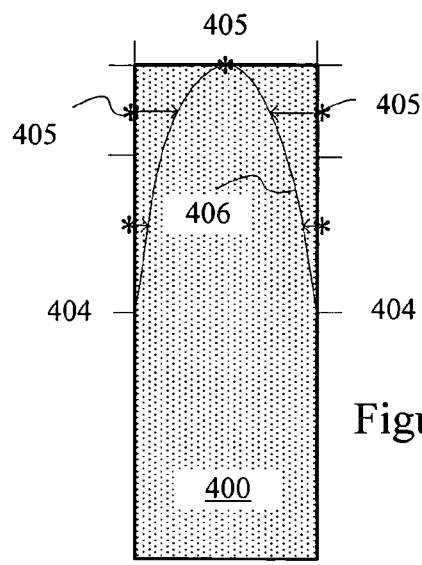
FIG. 4A illustrates a layout feature having a plurality of 2D segments defined by dissection points and evaluation points.

FIG. 4A illustrates a layout feature 400 having a plurality of 2D segments defined by dissection points 404 and evaluation points (shown as asterisks) 405. Determining the aerial image gradient at each evaluation point 405 can form an inscribed curve 406. That is, the aerial image gradient can be used to compute an offset (see arrows) from that evaluation point. The offsets can used to generate inscribed curve 406. Curve 406 represents an achievable shape for feature 400.

Figure 4B:
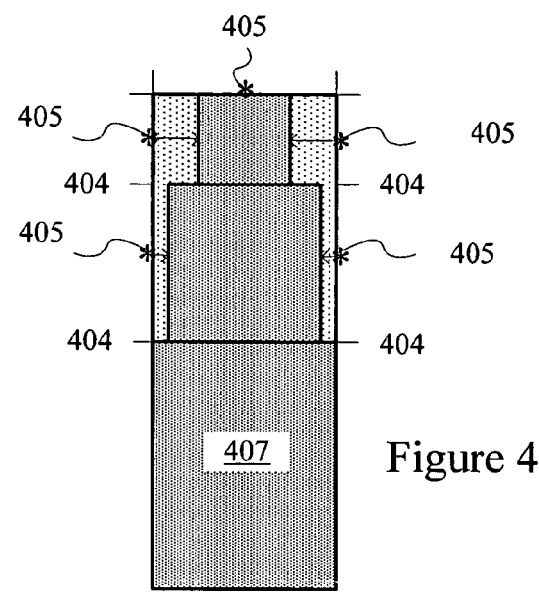
FIG. 4B illustrates an interpreted pattern of the feature in FIG. 4A using shifted 2D segments.

FIG. 4B illustrates an interpreted pattern 407 of feature 400 using shifted 2D segments from FIG. 4A. Interpreted pattern 407 can be considered the OPC target version of curve 406. In other words, the OPC tool is attempting to move the chrome edges so that inscribed curve 406 is achieved. Therefore, in accordance with one aspect of the invention, the 2D segments can be shifted by the same offsets used to generate inscribed curve 406. Exposing the correction of the interpreted pattern 407 during lithography would generate a line end having approximately the same shape as inscribed curve 406.

Figure 4C:
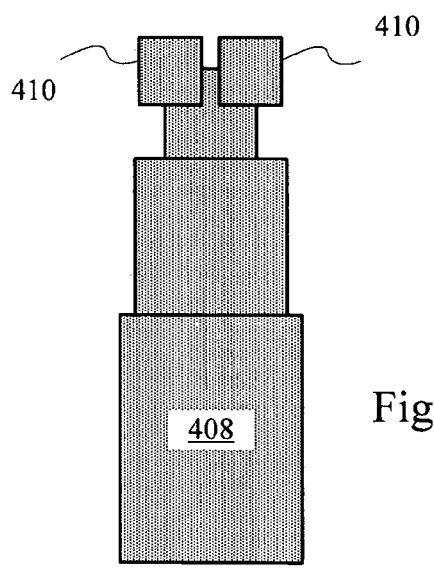
FIG. 4C illustrates an exemplary OPC-corrected feature based on the interpreted pattern of FIG. 4B.

FIG. 4C illustrates an exemplary OPC-corrected feature 408 based on interpreted pattern 407. Because interpreted pattern 407 is used, rather than layout feature 400, OPC is performed on a significantly more realistic target. Therefore, the resulting OPC features are minimized, e.g. serifs 410, which eliminates the potential for over-correction.

Figure 4D:
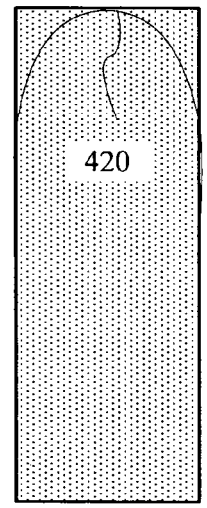
FIG. 4D illustrates a predicted output contour based on exposure of the OPC-corrected feature in FIG. 4C.

FIG. 4D illustrates a predicted output contour 420 based on an exposure of OPC-corrected feature 408 (the original feature is shown for reference). Notably, the bridging and pinching problems associated with an excessively aggressive OPC correction are not present. Thus, using an interpreted pattern can advantageously minimize the effects of or even eliminate the Q-tipping phenomenon.

Figure 5A:
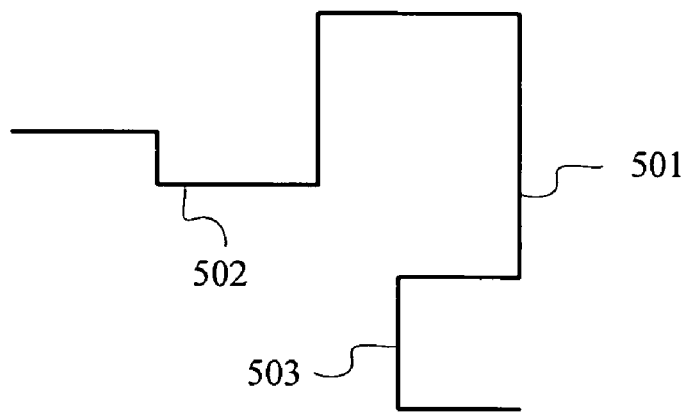
FIGS. 5A and 5B illustrate an OPC correction generated with and without an interpreted pattern, respectively.
Figure 5B:
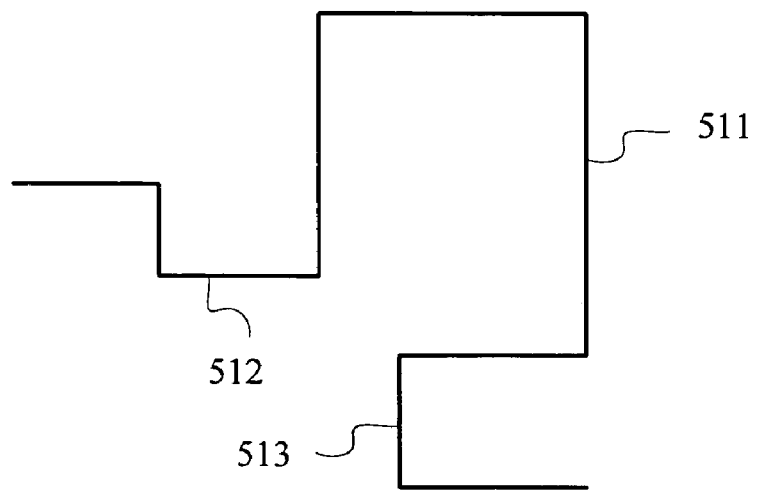

FIGS. 5A and 5B illustrate an OPC correction generated with and without an interpreted pattern, respectively. As noted above, interpretation filtering can advantageously create a realistic target. This realistic target means that smaller serifs are needed for OPC correction.

Serifs cause interference nodes to be generated along the line-edge. Specifically, a direct correlation exists between serif size and interference effects (i.e. large serifs generate large interference nodes whereas small serifs generate small interference nodes). Thus, referring to FIGS. 5A and 5B, OPC correction 500 that was generated with an interpreted pattern has a smaller serif 501 than larger serif 511 of OPC correction 510 that was generated without an interpreted pattern.

When a photolithography process is performed in an out of focus condition, high frequency components of the image are lost. When 2D compensations such as serif adjacent segment shifts (512 and 513, and 502 and 503) are used, they employ high frequency components to reduce the interference effects of the serif. When these segments have large shifts into the chrome, they are using more high frequency components than when they have small shifts. As the high frequency components are lost in defocus situations (as well as other process variation situations) features with more high frequency components will fail faster than those with fewer.

Unfortunately, when the lithographic process has any defocus (also called off-focus), the interference is blurred (i.e. high frequency components are lost) and becomes exaggerated, thereby significantly worsening the over-correction. For this reason, line ends with large serifs, which have large interference effects, will fail faster when defocusing occurs.

Advantageously, because the interpreted pattern reduces the size of the resulting serifs, lines ends can successfully resist failure through defocus. A similar tolerance to other through-process effects is noted for other 2D features on the mask. Thus, in general, smaller OPC features, which are possible due to use of interpreted patterns, are less sensitive to through-process effects.

FIGS. 5C, 5D, 5E, and 5F illustrate graphs plotting pullback (nm) versus number of occurrences for line ends on a mask layout. The pullback refers to the distance that the printed line varies from the desired line end. Thus, a positive pullback would mean a line that prints longer than desired and a negative pullback would mean a line that prints shorter than desired (which is also called an endcap margin).

An optimal pullback would be zero, i.e. the printed line end would coincide with the desired line end. In one process environment, negative pullbacks at or less than −5 nm (−6, −7, etc.) can be considered defective line ends. That is, a negative pullback may directly affect circuit performance if the line end is too short (e.g. a transistor may malfunction etc.). In contrast, assuming that lines have adequate spacing (thereby eliminating the possibility of bridging), positive pullbacks in this process environment are not considered defective line ends. For example, some space is generally provided between line ends on the mask. Therefore, extending line ends by an amount less than a predetermined limit (e.g. 25 nm) would still not affect circuit performance. Moreover, the lithographic process generally results in some shortening of line ends. Thus, even a significant extension of line ends on a mask could yield printed line ends that have less than significant pullback.

FIGS. 5C–5F show the pullback with line ends varying the following parameters: gap (the distance from a line end to the next feature), space (the distance from on-line to the next), and CD (set constant at 130 nm). The measurements in these graphs were generated using a 248 nm optical model. Note that some gaps are too small to accommodate a predetermined (e.g. 25 nm) extension and therefore may be assigned shorter, more appropriate extensions.

Figure 5C:
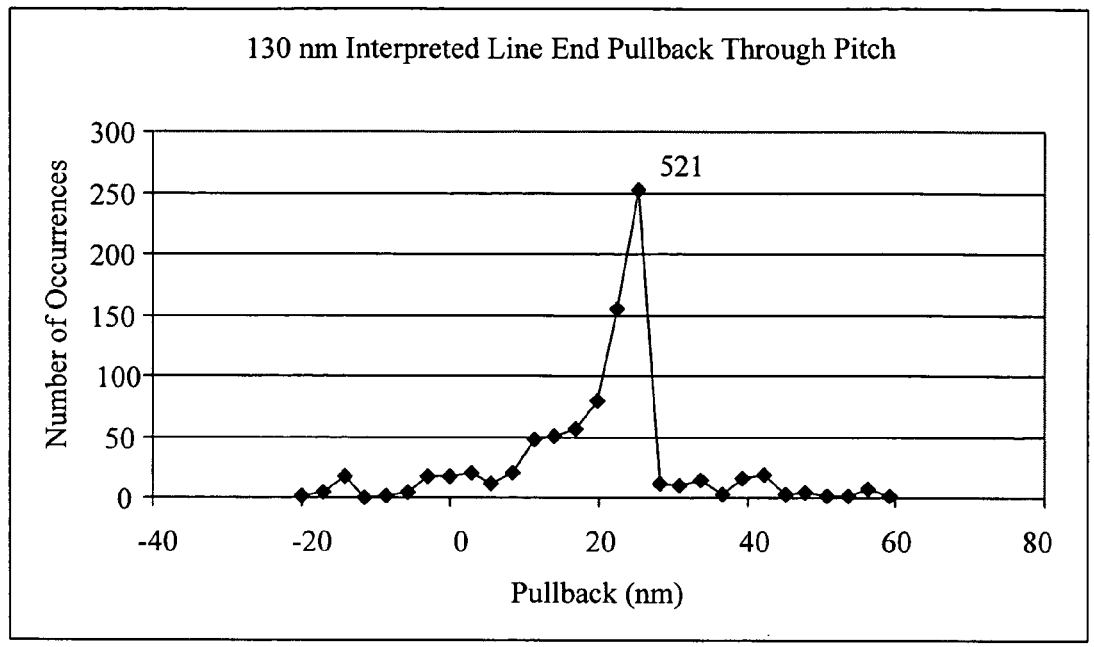
FIGS. 5C, 5D, 5E, and 5F illustrate graphs plotting pullback versus number of occurrences for line ends on a mask layout.
Figure 5D:
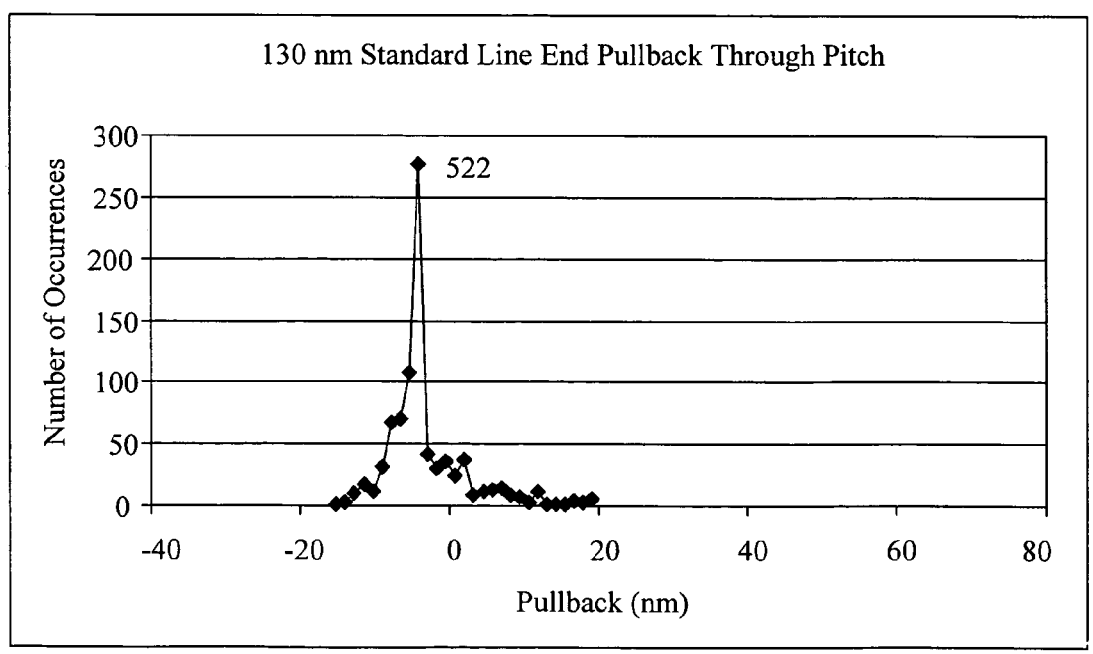

Referring to FIG. 5C, note that the highest number of occurrences for a mask generated using interpreted patterns is approximately at 25 nm (point 521), which is acceptable. In contrast and referring to FIG. 5D, the highest number of occurrences for a mask generated using standard patterns is approximately at −5 nm (point 522), which is unacceptable. Therefore, a mask generated using interpreted patterns has significantly more non-defective line ends than a mask generated using standard patterns.

Figure 5E:
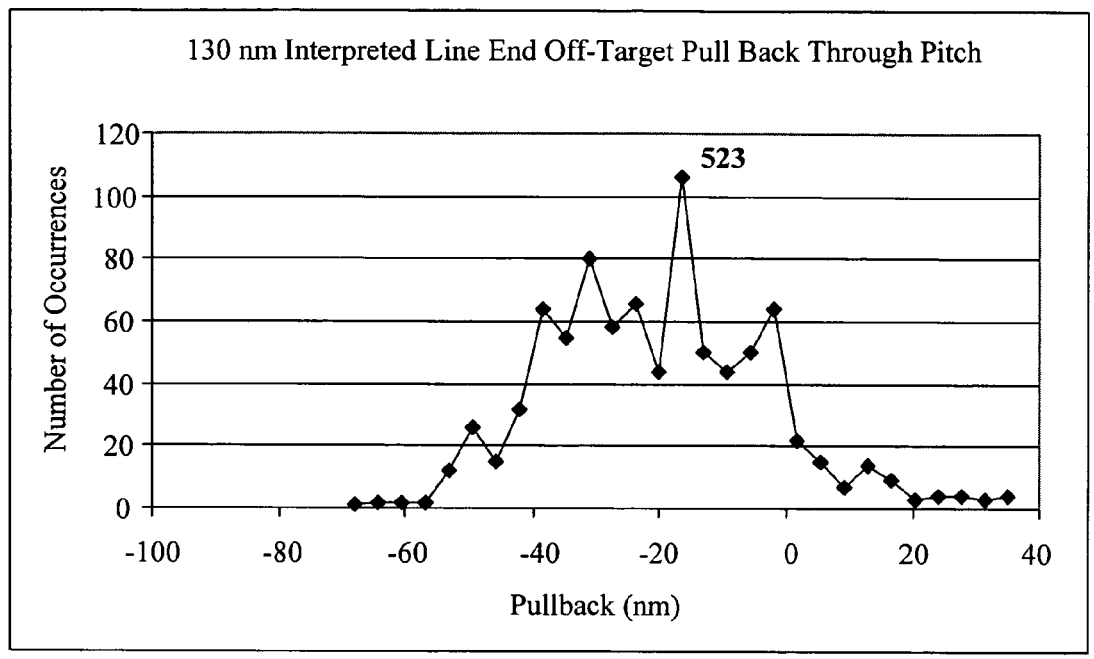
Figure 5F:
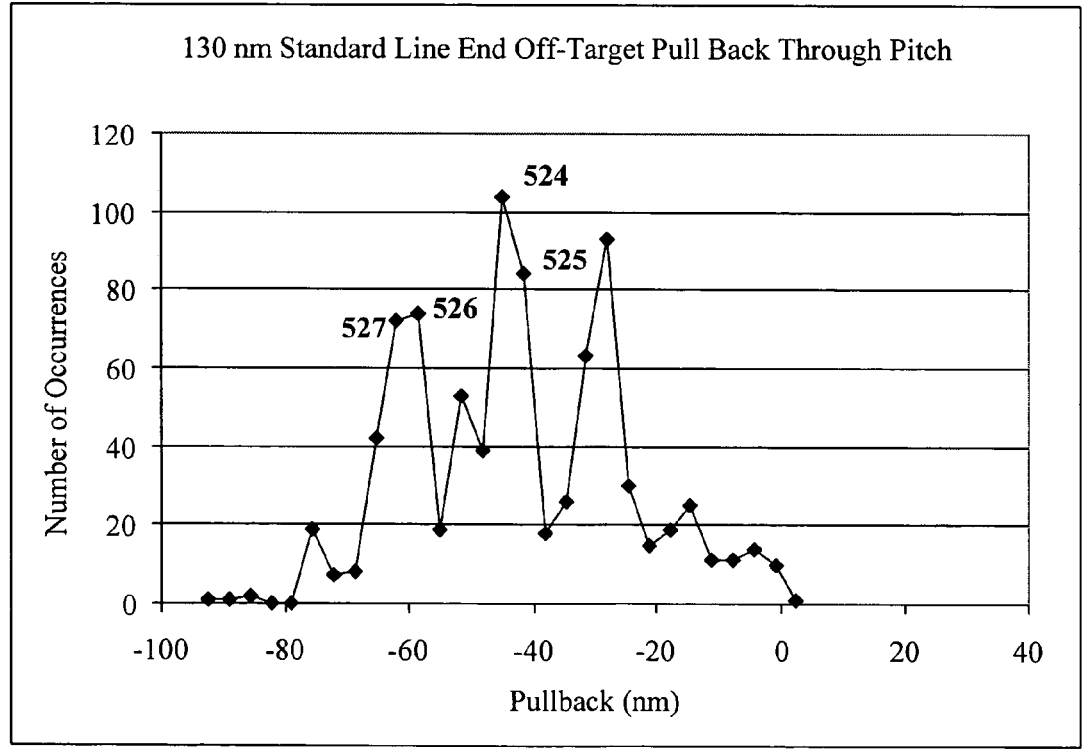

Defocus (also called off-target) typically worsens the number of defective line ends on a mask. FIGS. 5E and 5F illustrate computations done with off-target (−0.275 microns using the same 248 nm optical model) conditions. Note that in this process environment, negative pullbacks at or less than −40 nm can be considered defective line ends. Referring to FIG. 5E, the highest number of occurrences for a mask generated using interpreted patterns is approximately at −15 nm (point 523), which is acceptable. Indeed, even off-target, only a few unacceptable line ends less than −40 nm are present (i.e. 90% of the total number of line ends are acceptable).

In contrast and referring to FIG. 5F, the highest number of occurrences for a mask generated using standard patterns is approximately at −45 nm (point 524), which is unacceptable (and much worse pullback than −15 nm). Further note that points 525, 526, and 527 also indicate a high number of occurrences at approximately −42, −58, and −62 nm pullbacks, all of which are unacceptable. Notably, few acceptable line ends are present (i.e. roughly 60% of the total number of line ends are defective). Therefore, using interpreted patterns to generate a mask can advantageously minimize negative pullback, particularly under defocus conditions. Note that with different fit constants it may be possible to eliminate negative pullback even under defocus conditions.

In one embodiment, interpretation filtering can be manipulated to take advantage of spacing in a layout. For example, bulbous lines ends can be particularly risky when lines are closely spaced. However, for lines that are less closely spaced, bulbous line ends can provide distinct benefits. Specifically, a bulbous line end (without pinching) can advantageously survive better through process.

For example, FIG. 6A illustrates an exemplary mask layout 600 including lines 601-604. Line 602 has a large space on its left (i.e. the line 601 side) and a small space on its right (i.e. the line 603 side). Using the aerial image gradient, this spacing differential can be determined, as shown by curve 610 in FIG. 6B. In this case, a portion of a resulting interpreted pattern 615 (FIG. 6C) is shifted outside the original edge. Interpreted pattern 615 can be considered the OPC target version of curve 610.

FIG. 6D illustrates an exemplary OPC-corrected feature 620 based on interpreted pattern 615 of FIG. 6C. Note that because of the tilting of interpreted pattern 615, the resulting OPC features, in this case serifs 621, are asymmetric. Notably, the constants provided in the equations computing the normal shift can be chosen to intentionally make a more bulbous line end, without pinching, as shown by contour 630 in FIG. 6E. Advantageously, a bulbous line end is a larger feature and therefore can survive better through process. Therefore, interpretation filtering can be manipulated to provide greater process latitude where adequate space on the mask layout is available.

Although illustrative embodiments of the invention have been described in detail herein with reference to the figures, it is to be understood that the invention is not limited to those precise embodiments. They are not intended to be exhaustive or to limit the invention to the precise forms disclosed. For example, although the function of an evaluation point on or near a line end is discussed herein, the use of the aerial image gradient to provide the NormalShift (i.e. the offset) can also be applied to any 2D feature. In one embodiment, different features, e.g. line ends, outside corners, inside corners, slots, and jogs, can have different functions. In general, a function can use a linear approximation, an exponential ramp, or some other mathematical relationship.

Note that although embodiments herein describe sampling an aerial image and computing its gradient at predetermined points on 2D features, other embodiments can compute the gradient of the electric (E) field. Specifically, the aerial image is a map of intensity over an area and the intensity is E squared. Therefore, the two computations are functionally equivalent.

As such, many modifications and variations will be apparent. Accordingly, it is intended that the scope of the invention be defined by the following claims and their equivalents.

The invention claimed is:

1. A method of generating an interpreted pattern of a mask layout feature, the mask layout including edges dissected into a plurality of segments, each segment having an evaluation point, the method comprising:

identifying a two-dimensional segment;

measuring an aerial image gradient at the evaluation point of the two-dimensional segment;

determining a normal target shift for the two-dimensional segment based on the aerial image gradient at the evaluation point, wherein determining the normal target shift for the two-dimensional segment includes determining a measured aerial image magnitude and at least one of a measured angle of the aerial image gradient, a plurality of empirically-derived fit constants, a base angle where no shift is applied, and a base magnitude where no shift is applied;

modifying a target position of the segment using the normal target shift; and saving the modified target position as part of the interpreted pattern, wherein the modified target position provides a more realistic optical proximity correction target.

2. The method of claim 1, wherein the interpreted pattern includes the modified positions of all two-dimensional segments.

3. The method of claim 1, wherein the two-dimensional segment forms part of one of a line end, an outside corner, an inside corner, a slot, and a jog.

4. The method of claim 1, wherein the two-dimensional segment is optically influenced by one of a line end, an outside corner, an inside corner, a slot, and a jog.

5. A method of generating an interpreted pattern of a mask layout feature, the mask layout including edges dissected into a plurality of segments, each segment having an evaluation point, the method comprising:

identifying a two-dimensional segment;

measuring an aerial image gradient at the evaluation point of the two-dimensional segment;

determining a normal shift for the two-dimensional segment based on the aerial image gradient at the evaluation point, wherein determining the normal shift for the two-dimensional segment includes:

determining a nominal shift, a maximum normal shift component due to the aerial image gradient, a measured angle of the aerial image gradient, a base angle where no shift is applied, a maximum normal shift component due to the aerial image magnitude, a measured aerial image magnitude, and a base magnitude where no shift is applied; modifying a position of the segment using the normal shift; and saving the modified position as part of the interpreted pattern.

6. A method of generating an interpreted pattern of a mask layout feature, the mask layout including edges dissected into a plurality of segments, each segment having an evaluation point, the method comprising:

identifying a two-dimensional segment;

measuring an aerial image gradient at the evaluation point of the two-dimensional segment;

determining a normal shift for the two-dimensional segment based on the aerial image gradient at the evaluation point;

modifying a position of the segment using the normal shift; and saving the modified position as part of the interpreted pattern, wherein determining the normal shift for the two-dimensional segment is computed using one of the following three equations:

$$NormalShift = -\frac{GradientMagnitude^2}{Q} - \frac{GradientMagnitude}{R} - S$$

$$NormalShift = T_0 - AngleShift\left(1 - \frac{GradientAngle}{GradientAngle_0}\right) -$$

$$MagShift\left(1 - \frac{GradientMagnitude}{GradientMagnitude_0}\right)$$

-continued $$NormalShift = -\frac{GradientMagnitude^2}{F} - \frac{GradientAngle^2}{G} - \frac{GradientMagnitude}{H} - \frac{GradientAngle}{J} - \frac{GradientAngle * GradientMagnitude}{K} - L$$

wherein F, G, H, J, K, L, Q, R, and S are empirically-derived fit constants based on sampled corner performance, $T_0$ is the nominal normal shift, AngleShift is the maximum normal shift component due to the aerial image gradient, GradientAngle is the measured angle of the aerial image gradient, $GradientAngle_0$ is the base angle where no shift is applied, MagShift is the maximum normal shift component due to the aerial image magnitude, GradientMagnitude is the measured aerial image magnitude, and $GradientMagnitude_0$ is the base magnitude where no shift is applied.

7. A method of generating an interpreted pattern of a mask layout feature, the mask layout including edges dissected into a plurality of segments, the method comprising:
identifying a two-dimensional segment;
using an aerial image to determine an influence on that two-dimensional segment;
determining a normal target shift for the two-dimensional segment based on the influence, wherein determining the normal target shift for the two-dimensional segment includes determining a measured aerial image magnitude and at least one of a measured angle of an aerial image gradient, a plurality of empirically-derived fit constants, a base angle where no shift is applied, and a base magnitude where no shift is applied;
modifying a target position of the segment using the normal target shift; and
saving the modified target position as part of the interpreted pattern, wherein the modified target position provides a more realistic optical proximity correction target.

8. The method of claim 7, wherein the interpreted pattern includes the modified positions of all two-dimensional segments.

9. The method of claim 7, wherein the two-dimensional segment forms part of one of a line end, an outside corner, an inside corner, a slot, and a jog.

10. The method of claim 7, wherein the two-dimensional segment is optically influenced by one of a line end, an outside corner, an inside corner, a slot, and a jog.

11. A method of generating an interpreted pattern of a mask layout feature, the mask layout including edges dissected into a plurality of segments, the method comprising:
identifying a two-dimensional segment;
using an aerial image to determine an influence on that two-dimensional segment;
determining a normal shift for the two-dimensional segment based on the influence;
modifying a position of the segment using the normal shift; and
saving the modified position as part of the interpreted pattern,
wherein the influence includes an aerial image gradient, and wherein determining the normal shift for the two-dimensional segment includes:
determining a nominal shift, a maximum normal shift component due to the aerial image gradient, a measured angle of the aerial image gradient, a base angle where no shift is applied, a maximum normal shift component due to the aerial image magnitude, a measured aerial image magnitude, and a base magnitude where no shift is applied.

12. A method of generating an interpreted pattern of a mask layout feature, the mask layout including edges dissected into a plurality of segments, the method comprising:
identifying a two-dimensional segment;
using an aerial image to determine an influence on that two-dimensional segment;
determining a normal shift for the two-dimensional segment based on the influence;
modifying a position of the segment using the normal shift; and
saving the modified position as part of the interpreted pattern,
wherein determining the normal shift for the two-dimensional segment is computed using one of the following three equations:

$$NormalShift = -\frac{GradientMagnitude^2}{Q} - \frac{GradientMagnitude}{R} - S$$

$$NormalShift = T_0 - AngleShift\left(1 - \frac{GradientAngle}{GradientAngle_0}\right) - MagShift\left(1 - \frac{GradientMagnitude}{GradientMagnitude_0}\right)$$

$$NormalShift = -\frac{GradientMagnitude^2}{F} - \frac{GradientAngle^2}{G} - \frac{GradientMagnitude}{H} - \frac{GradientAngle}{J} - \frac{GradientAngle * GradientMagnitude}{K} - L$$

wherein F, G, H, J, K, L, Q, R, and S are empirically-derived fit constants based on sampled corner performance, $T_0$ is the nominal normal shift, AngleShift is the maximum normal shift component due to the aerial image gradient, GradientAngle is the measured angle of the aerial image gradient, $GradientAngle_0$ is the base angle where no shift is applied, MagShift is the maximum normal shift component due to the aerial image magnitude, GradientMagnitude is the measured aerial image magnitude, and $GradientMagnitude_0$ is the base magnitude where no shift is applied.

13. A method of performing optical proximity correction on a mask layout, the method comprising:
receiving the mask layout, the mask layout including a plurality of features;
performing interpretation filtering to generate an interpreted pattern for at least one feature, the interpreted pattern providing a realistic optical proximity correction target, the interpretation filtering including computing an aerial image gradient, determining a magnitude of the aerial image gradient, and determining at least one of an angle of the aerial image gradient, a plurality of empirically-derived fit constants, a base angle where no shift is applied, and a base magnitude where no shift is applied; and
running optical proximity correction using the interpreted pattern.

14. The method of claim 13, further including dissecting edges of the features, thereby forming a plurality of segments.

15. The method of claim 14, further including identifying two-dimensional segments.

16. The method of claim 15, wherein interpretation filtering is performed only on two-dimensional segments.

17. The method of claim 14, wherein interpretation filtering is performed on segments on and near any corners.

18. The method of claim 17, wherein the segments form part of at least one of line ends, inner corners, outer corners, cutouts, slot ends, and jogs.

19. The method of claim 14, wherein interpretation filtering includes computing aerial image gradients at evaluation points on the segments.

20. The method of claim 19, wherein interpretation filtering further includes using the aerial image gradients to determine normal shifts to the segments.

21. The method of claim 13, further including performing a Boolean clean-up operation on at least one feature.

22. The method of claim 21, wherein the Boolean clean-up operation includes at least one of:
checking design rules (DRC);
filling notches; and
removing overlays.

23. The method of claim 13, further including performing a Boolean sizing operation.

24. The method of claim 13, further including performing a segment clean up.

25. The method of claim 13, wherein receiving, performing, and running can be implemented in a software tool.

26. The method of claim 13, wherein running optical proximity correction using the interpreted pattern generates a corrected pattern, the method further including performing interpretation filtering on the corrected pattern and then re-running optical proximity correction.

27. A computer-readable medium embodying a computer-implemented program for performing optical proximity correction on a mask layout, the computer-implemented program comprising:
instructions for receiving the mask layout, the mask layout including a plurality of features;
instructions for performing interpretation filtering, the interpretation filtering generating an interpreted pattern for at least one feature, the interpreted pattern providing a realistic optical proximity correction target, the interpretation filtering including computing an aerial image gradient, determining a magnitude of the aerial image gradient, and determining at least one of an angle of the aerial image gradient, a plurality of empirically-derived fit constants, a base angle where no shift is applied, and a base magnitude where no shift is applied; and
instructions for running optical proximity correction using the interpreted pattern.

28. The computer-readable medium of claim 27, further including instructions for dissecting edges of the features, thereby forming a plurality of segments.

29. The computer-readable medium of claim 28, further including instructions for identifying two-dimensional segments.

30. The computer-readable medium of claim 29, wherein the instructions for performing interpretation filtering are directed only to two-dimensional segments.

31. The computer-readable medium of claim 28, wherein the instructions for performing interpretation filtering are directed to segments on and near any corners.

32. The computer-readable medium of claim 31, wherein the segments form part of at least one of line ends, inner corners, outer corners, cutouts, slot ends, and jogs.

33. The computer-readable medium of claim 28, wherein the instructions for performing interpretation filtering compute aerial image gradients at evaluation points on the segments.

34. The computer-readable medium of claim 33, wherein the instructions for performing interpretation filtering use the aerial image gradients to determine normal shifts to the segments.

35. A method of generating an interpreted pattern of a mask layout feature, the mask layout including edges dissected into a plurality of segments, each segment having an evaluation point, the mask layout further including a space of at least a predetermined size such that a line adjacent the space, when exposed during lithography, could have a bulbous line end, the method comprising:
identifying a two-dimensional segment on the line, the two-dimensional segment being adjacent the space;
measuring an aerial image gradient at the evaluation point of the two-dimensional segment;
determining a normal target shift for the two-dimensional segment based on the aerial image gradient at the evaluation point, wherein determining the normal target shift for the two-dimensional segment includes determining a measured aerial image magnitude and at least one of a measured angle of the aerial image gradient, a plurality of empirically-derived fit constants, a base angle where no shift is applied, and a base magnitude where no shift is applied;
modifying a target position of the segment using the normal target shift, wherein a modified target position is outside the line; and
saving the modified target position as part of the interpreted pattern, wherein the modified target position provides a more realistic optical proximity correction target.

36. The method of claim 35, wherein each empirically-derived fit constant is based on sampled corner performance.

* * * * *